(12) United States Patent
Ishida

(10) Patent No.: US 7,171,743 B2
(45) Date of Patent: Feb. 6, 2007

(54) APPARATUS AND METHOD FOR WARPAGE COMPENSATION OF A DISPLAY PANEL SUBSTRATE ASSEMBLY

(75) Inventor: Kenzo Ishida, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 316 days.

(21) Appl. No.: 10/841,350

(22) Filed: May 7, 2004

(65) Prior Publication Data

US 2004/0209542 A1 Oct. 21, 2004

Related U.S. Application Data

(62) Division of application No. 10/302,282, filed on Nov. 22, 2002, now Pat. No. 6,798,137.

(60) Provisional application No. 60/369,958, filed on Apr. 4, 2002.

(51) Int. Cl.
*H05K 3/30* (2006.01)

(52) U.S. Cl. .............................. 29/832; 29/840; 29/842; 29/843

(58) Field of Classification Search .................. 29/601, 29/825, 832, 840, 842, 843
See application file for complete search history.

(56) References Cited

U.S. PATENT DOCUMENTS

| 5,119,240 | A  | * | 6/1992  | Marion et al. ............... 359/850 |
| 5,971,253 | A  | * | 10/1999 | Gilleo et al. ........... 228/180.22 |
| 6,094,138 | A  | * | 7/2000  | Eberhardt et al. ....... 340/572.1 |
| 6,234,373 | B1 | * | 5/2001  | Wark ........................... 228/19 |
| 6,464,124 | B2 | * | 10/2002 | Wark ........................... 228/19 |
| 6,642,652 | B2 |   | 11/2003 | Collins, III et al. |

* cited by examiner

*Primary Examiner*—Carl J. Arbes
(74) *Attorney, Agent, or Firm*—Blakely, Sokoloff, Taylor & Zafman LLP

(57) ABSTRACT

An apparatus and method for warpage compensation of a display panel substrate assembly are described. A method and apparatus for warpage compensation of a display panel substrate assembly are described. In one embodiment, the method includes the selection of a substrate having a substrate warpage level exceeding a warpage tolerance level. Once selected, a plurality of conductive bumps are formed over an area of the selected substrate. Once formed, a thermal process is applied to the plurality of conductive bumps to obtain a virtual plane over the area of the selected substrate have a coplanarity level below a coplanarity specification level. As such, utilizing embodiments of the present invention, lower cost substrates with substandard warpage levels may be utilized to form OLED panel substrate assemblies when compensated utilizing embodiments of the present invention.

10 Claims, 8 Drawing Sheets

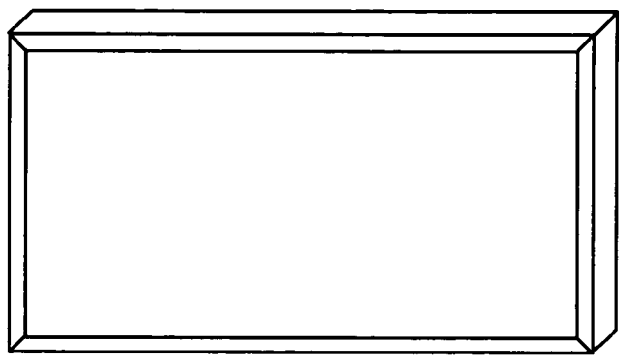
FLAT-SCREEN TV 100
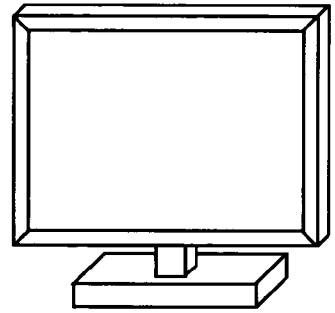
FLAT-SCREEN MONITOR
110
FIG. 1

OLED STRUCTURE 200

APPARATUS AND METHOD FOR WARPAGE COMPENSATION OF A DISPLAY PANEL SUBSTRATE ASSEMBLY

RELATED APPLICATIONS

This application is a divisional application of U.S. application Ser. No. 10/302,282, filed Nov. 22, 2002, now U.S. Pat. No. 6,798,137, which application is a non-provisional application of U.S. Provisional Ser. No. 60/369,958, filed Apr. 4, 2002, now expired.

FIELD

One or more embodiments relate generally to the field of organic light-emitting diode (OLED) displays. More particularly, one or more of the embodiments relates to a method and apparatus for warpage compensation of a display panel substrate assembly.

BACKGROUND

Traditional liquid crystal displays (LCDs) are utilized as conventional display devices. Unfortunately, LCDs require backlighting, as well as diffusers and polarizers, since LCD displays are not self-luminous. Furthermore, the backlighting is generally provided by bulky and environmentally undesirable mercury lamps, which consume inordinate amounts of power. Likewise, the lumination within LCDs often generates undesirable amounts of heat and causes electrical interference within attached electronic devices. As a result, LCDs generally require substantial space and are often quite heavy.

In contrast, organic light-emitting diode (OLED) technology generally enables full color, full motion, flat panel displays, with a level of brightness and sharpness not possible with traditional LCDs. Moreover, unlike traditional LCDs, OLEDs are self-luminous. As a result, flat panel displays utilizing OLEDs do not incur many of the problems suffered by traditional LCDs.

An OLED structure, which is utilized to enable an OLED display device generally includes organic carbon-based film layers between two charged electrodes. A first electrode is commonly a metallic or conductive cathode, while a second electrode is commonly a transparent anode, generally made of glass. The organic film layers may comprise a hole injection layer, a hole transport layer, an emissive layer and an electron transport layer.

In operation, a voltage potential is applied to an OLED structure to provide lumination within the OLED display device. When the charge is applied, the injected positive and negative charges within the OLED recombine in an emissive layer in order to create electroluminescent light. As a result, OLED displays emit light, in contrast with conventional display technologies, such as LCD displays, which modulate transmitted or a reflected light.

An OLED structure may also include a ceramic panel and a conductive adhesive contact. In order to construct panels, such as OLED displays, some kind of substrate, such as a ceramic, organic or metallic plate, is required. As such, the substrate enables assembly of an OLED panel that is constructed of glass or organic film in order to enable connection to an electric circuit. However, in order to enable full motion flat panel displays, a warpage tolerance/coplanarity specification value required of selected substrates is generally less than 30 micros per inch (micron/inch).

Unfortunately, the coplanarity specification required for OLED flat panel displays drastically increases the cost to manufacturers of OLED displays. In order to address the warpage tolerance coplanarity specification requirements, manufacturers of conventional OLED displays generally utilize higher cost ceramic substrates. Otherwise, the manufacturers utilize special treatments (polishing), which are applied to ceramic substrates to reduce the warpage level of the substrate to conform to required tolerances. Consequently, conventional processes for enabling flat panel OLED display construction significantly increase the costs of substrate material.

BRIEF DESCRIPTION OF THE DRAWINGS

The various embodiments are illustrated by way of example, and not by way of limitation, in the figures of the accompanying drawings and in which:

FIG. 1 depicts block diagrams illustrating a flat screen television (TV), as well as a flat screen monitor.

DETAILED DESCRIPTION

Figure 2:
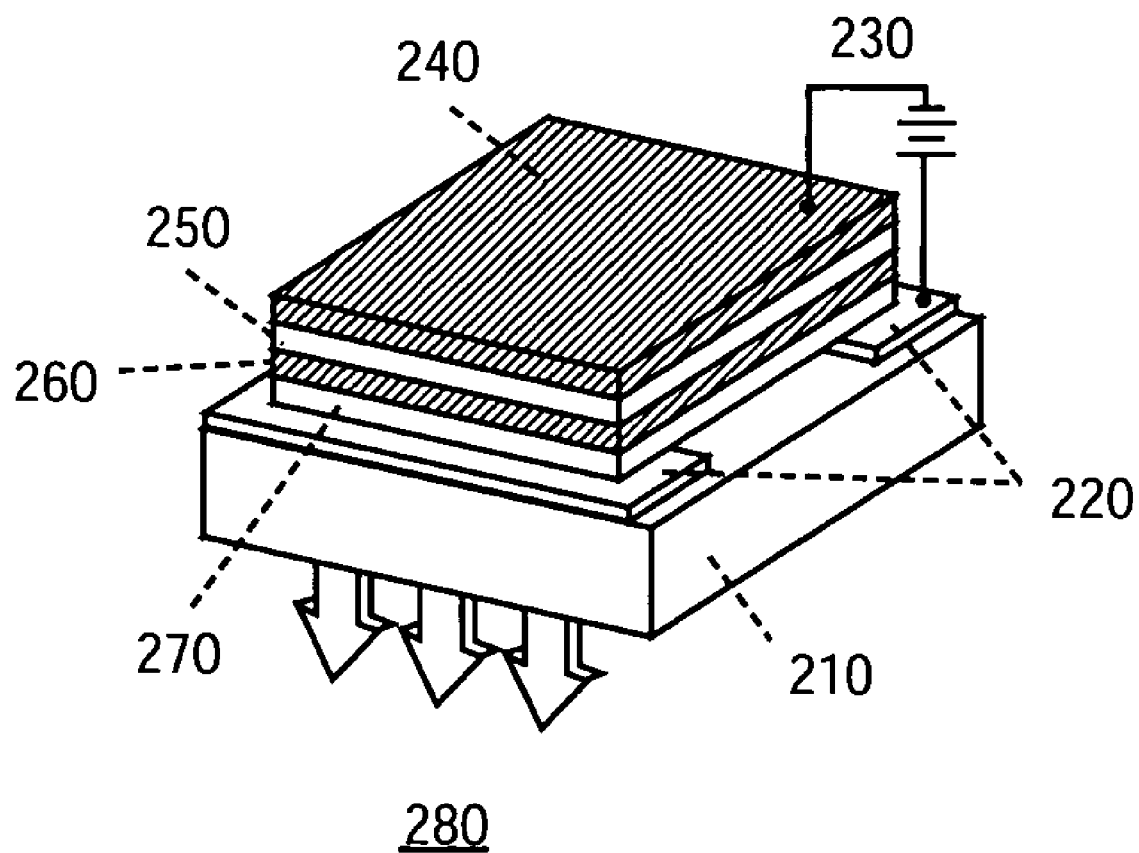
FIG. 2 depicts a block diagram illustrating an optical light emitting diode (OLED) structure.

A method and apparatus for warpage compensation of a display panel substrate assembly are described. In one embodiment, the method includes the selection of a substrate having a substrate warpage level exceeding a warpage tolerance level. Once selected, a plurality of conductive bumps are formed over an area of the selected substrate. Once the conductive bumps are formed, a thermal process is applied to the plurality of conductive bumps to obtain a virtual surface over the area of the selected substrate have a maximum coplanarity level below a coplanarity specification level.

In one embodiment, the apparatus includes a substrate including a plurality of conductive bumps having a virtual plane with a coplanarity level below the maximum coplanarity specification level. The virtual surface is formed by applying a thermal process to the plurality of conductive bumps. An adhesive conductive layer formed over the virtual surface. In addition, the apparatus includes an OLED panel layer coupled to the substrate via the adhesive conductive layer to connect electrodes between the OLED panel and the substrate. As such, utilizing embodiments of the present invention, lower cost substrates with substandard warpage levels may be utilized to form OLED panel substrate assemblies when compensated utilizing embodiments of the present invention.

In the following description, for the purposes of explanation, numerous specific details are set forth in order to provide a thorough understanding of the embodiments of the present invention. It will be apparent, however, to one skilled in the art that the various embodiments of the present invention may be practiced without some of these specific details. For example, various substrates and conductive bump configurations may be modified according to the embodiments of the present invention to provide the desired virtual surface coplanarity level.

In addition, the following description provides examples, and the accompanying drawings show various examples for the purposes of illustration. However, these examples should not be construed in a limiting sense as they are merely intended to provide examples of the embodiments of the present invention rather than to provide an exhaustive list of all possible implementations of the embodiments of the present invention. In other instances, well-known structures and devices are shown in block diagram form in order to avoid obscuring the details of the various embodiments of the present invention.

FIG. 1 depicts block diagrams illustrating flat screen TV 100, as well as flat screen monitor 110. In contrast to conventional televisions, as well as computer monitors, flat screen TV 100 and flat screen monitor 110 are drastically smaller than conventional televisions and monitors. However, flat screen TV 100, as well as flat screen monitor 110, include a screen size, which is as large, if not larger, than a corresponding contemporary devices. Flat screen devices depicted in FIG. 1 have become a reality due to the use of, for example, optical light emitting diodes (OLED).

As indicated above, traditional liquid crystal displays (LCDs) are generally not self-luminous. As a result, backlighting is required to illuminate the displays, which is provided by bulky environmentally undesirable mercury lamps, which consume an inordinate amount of power. As a result, LCDs generally require substantial space, and are often quite heavy in contrast to the flat panel displays depicted in FIG. 1. In contrast, organic light emitting diode technology enables full color, full motion, flat panel displays with a level of brightness and sharpness that is not possible with traditional LCDs. Moreover, unlike traditional LCDs, OLEDs are self-luminous. As a result, flat panel display modules constructed utilizing OLEDs do not incur many of the problems suffered by traditional LCDs.

FIG. 2 depicts OLED structure 200, which may be utilized within flat panel displays, as depicted in FIG. 1. OLED structure 200 generally includes organic carbon-based film layers between two charged electrodes. For example, OLED structure 200 includes glass substrate 210, including, for example, transparent anode 220, generally made of glass or indium-tin oxide (ITO). The organic layers comprise a hole injection layer (HIL) 270, organic emitters 260, as well as electron transport layer (ETL) 250. Likewise, OLED structure 200 includes metal cathode 240 above organic film layers (250, 260 and 270).

In operation, voltage potential 230 is applied to OLED structure 200 in order to provide rumination within an OLED display device utilizing OLED structure 200. When the charge is applied, the injected positive and negative charges within OLED structure 200 recombine in an emissive layer in order to create electroluminescent light. As a result, OLED displays emit light, in contrast with conventional display technology, such as LCD displays, which modulate transmitted or reflected light. As such, when voltage potential 230 of, for example, two ten volts direct current is applied to metal cathode 240 and anode 220, light output 280 is generated from OLED structure 200.

Figure 3:
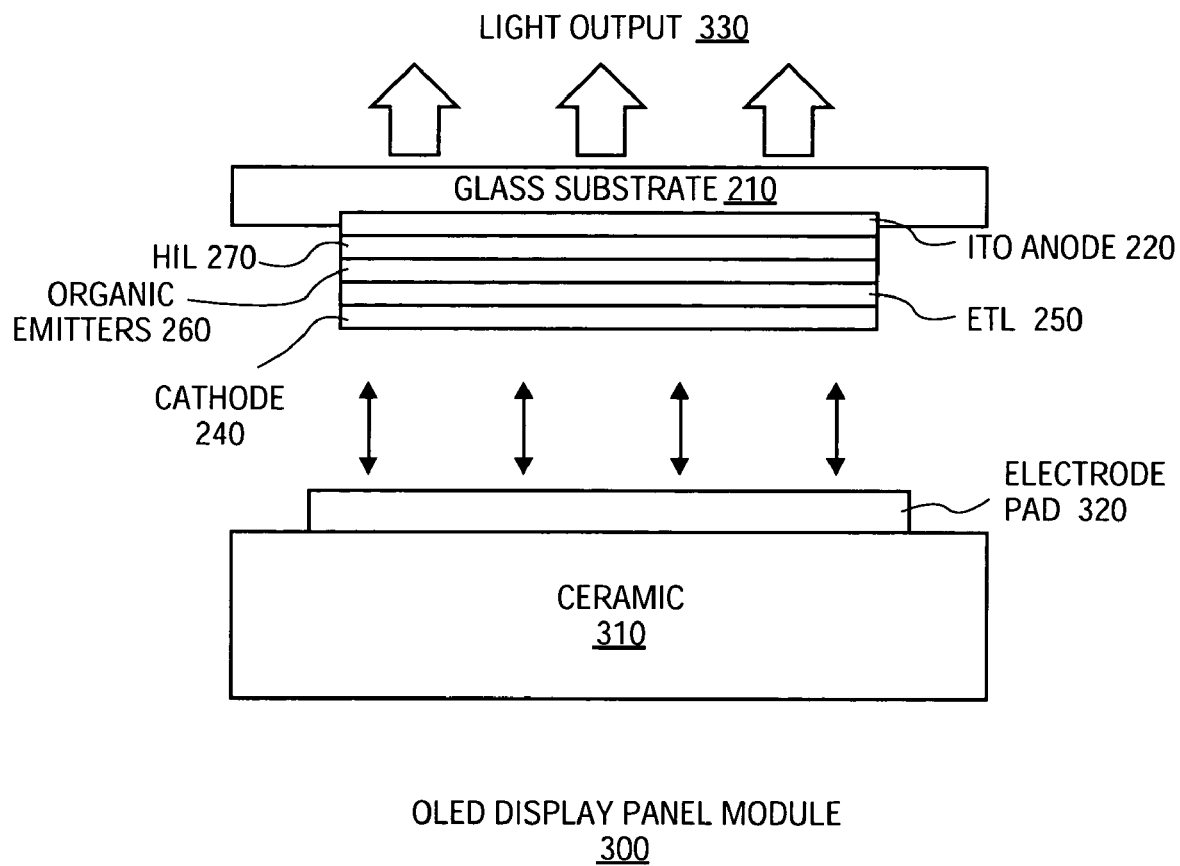
FIG. 3 depicts a block diagram illustrating an OLED display panel module.

Conventionally, OLED structure 200 may be utilized to form an OLED display module, for example, as depicted in FIG. 3. As illustrated in FIG. 3, OLED display panel module 300 is formed utilizing OLED structure 200, for example, as depicted in FIG. 2. In order to construct OLED display panel module 300, as depicted in FIG. 3, some kind of substrate 310, such as a ceramic, organic or metallic plate is required.

As such, substrate 310 enables assembly of an OLED panel that is constructed of a glass organic film in order to enable connection to an electric circuit, for example, to provide a voltage potential between cathode 240 and anode 220, to generate rumination from glass structure 210. However, in order to meet the strict tolerances required to manufacture flat panel displays, for example, as depicted in FIG. 1, a warpage tolerance/coplanarity specification value required of selected substrates, for example, substrate 310, is generally less than 30 micros per inch.

Unfortunately, the coplanarity specification level required for OLED flat panel displays drastically increases the cost to manufacture OLED displays, such as flat panel TVs, as well as flat panel screen 120, as depicted in FIG. 1. In order to address the warpage tolerance/coplanarity specification requirements, manufacturers of conventional OLED displays generally utilize higher cost ceramic substrates having a coplanarity level, which is at most equal to the 30 micron per inch coplanarity specification value required for OLED display devices. Otherwise, the manufacturers utilize special treatments, such as polishing, which are applied to ceramic substrates in order to remove warpage from the substrates such that the final substrate includes a coplanarity value, which is less than the 30 microns per inch coplanarity specification requirement.

As a result of the warpage tolerance/coplanarity specification requirements for substrates utilized within OLED display panel modules, flat screen TVs, as well as monitors, utilizing OLED display panel modules are often quite expensive. As indicated, substantial costs are further exacerbated by finding substrates which comply with the coplanarity specification requirements. However, in order to combat the coplanarity specification requirements for OLED display panel modules, FIGS. 4A–4E illustrate an embodiment for performing warpage compensation of a substrate to enable usage of the substrate within an OLED display panel module assembly.

FIG. 4A depicts substrate 410, which has an undesirable warpage level, which may be in the range of 60 microns per inch through 700 microns per inch. Conventional coplanarity specification requirements are generally, at most, 30 microns per inch, which is quite uncommon in substrate materials used widely in the semiconductor industry. Such substrate material includes, for example, alumina ceramic, low temperature co-fired ceramic and other various ceramics, as well as printed circuit boards utilizing organic (plastic) substrate materials. Accordingly, the OLED display industry is now trying to adopt a standard of using only ceramic substrates, as well as adding special treatment, to reduce the warpage level down to within half of the industry specification.

Unfortunately, adoption of the standard proposed by the manufacturers of flat screen devices will significantly increase substrate cost. In addition, substrate development work will also be required. Consequently, in order to comply with the coplanarity specification requirements for substrates utilized within OLED displays, one embodiment includes a process for compensation of substrate warpage, for example, as depicted in FIGS. 4A–4C.

Referring now to FIG. 4A, substrate 410 is selected, which has an undesirably high warpage level. As a result, a substrate coplanarity level of the surface of substrate 410 generally exceeds the maximum coplanarity specification value of, for example, 30 microns per inch. Therefore, in accordance with one embodiment, conductive bumps 420 are formed upon an area of substrate 410. In one embodiment, conductive bumps 420 may be formed onto electrode pads of substrate 410 (not shown).

In one embodiment, the conductive bumps 420 are generally configured as soft bumps, which require electrical conductivity, as well as deformation characteristics at a certain temperature. In one embodiment, the conductive bumps may have a diameter within the range of 50 μm to 300 μm depending on the desired resolution. In one embodiment, the electrode pads are comprised of a material including ITO, Aluminum pad with gold flash plating, or electric pads with Ni/Au plating or Sn plating.

Accordingly, the soft bumps may be comprised of a material including various metals, such as solder bumps, as well as conductive plastic-elastic materials, such as, but not limited to Pb/Sn alloy Au, conductive rubber, and the like. Once conductive bumps 420 are formed upon substrate 410, hot coining/stamping tool 430 may be applied to conductive bumps 420. As such, in embodiment depicted in FIG. 4B, a hot coining/stamping tool 430 is applied to conductive bumps 420. Once applied, hot coining/stamping tool 430 will cause the formation of a virtual plane (surface) 440 over the soft bumps, for example, as depicted in FIG. 4C. In general, a tool with up/down stroke motion with some dead weight control may be used as tool 430. Precise alignment is generally not required, since bump coining is performed for a desired area.

In the embodiments depicted, the virtual surface 440 will have a coplanarity level, which at most is equal to the coplanarity specification requirement value of, for example, 30 microns per inch. Accordingly, after coining/stamping conductive bumps 420, virtual surface 440 is formed, which has an acceptable coplanarity level. As such, virtual surface 440 enables the formation of warpage compensated substrate 400, as depicted in FIG. 4C. Consequently, utilizing the warpage compensated substrate, an OLED display panel module assembly may be formed utilizing a substrate, which initially fails to meet the coplanarity specification requirement.

Figure 4:
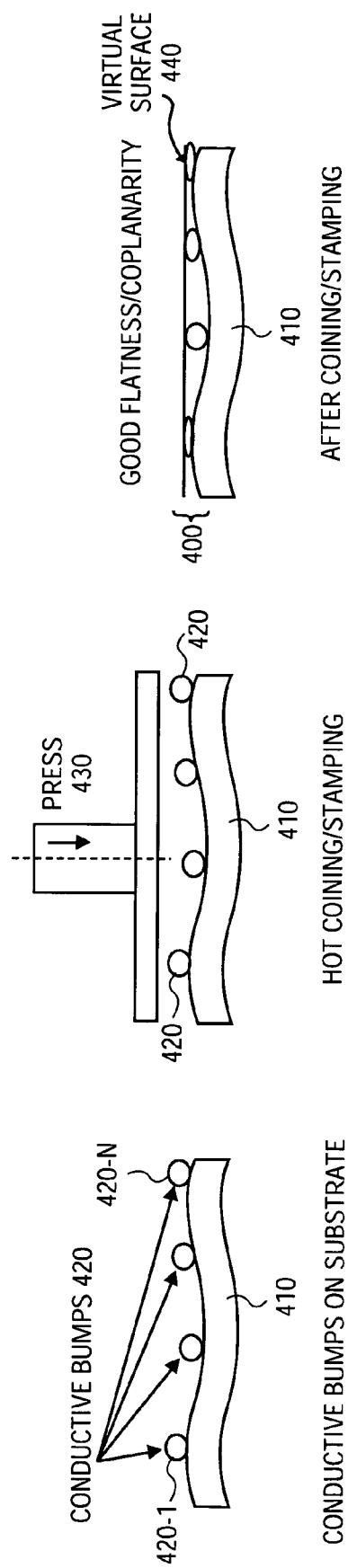
FIGS. 4A–4C depict block diagrams illustrating warpage compensation of a substrate.
Figure 5:
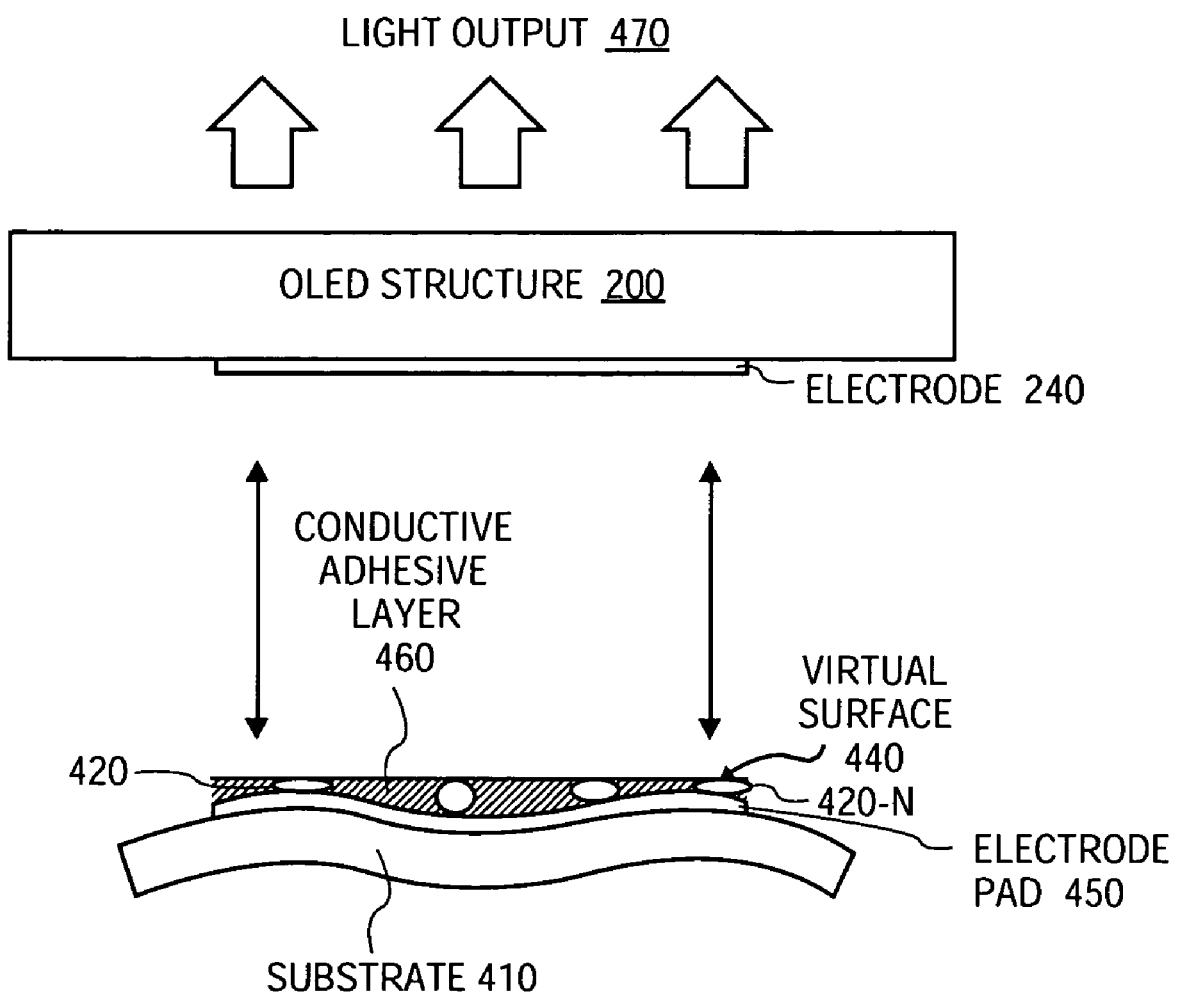
FIG. 5 depicts a block diagram illustrating formation of an OLED display panel module utilizing a warpage compensated substrate.

FIG. 5 depicts the formation of an OLED display panel module assembly utilizing warpage compensated substrate 400 of FIG. 4. As illustrated, OLED structure 200, for example, as depicted in FIG. 2, will include electrode 240. Electrode 240 generally requires a current source to generate light output 470. As such, in accordance with one embodiment, a conductive adhesive layer 460 of, for example, Pb/Sn conductive layer, is formed onto the virtual surface 440 and over electrode pad 450.

Consequently, utilizing conductive adhesive layer 460, an electronic connection is formed between electrode pad 450 and OLED electrode 240 to enable application of a voltage potential between substrate 410 and OLED structure 200 to generate light output 470. As such, an OLED display panel module assembly is generated in accordance with the embodiment depicted in FIG. 5 to generate light output 470 and may be used to form a flat panel display television or screen, for example as depicted in FIG. 1.

Figure 6:
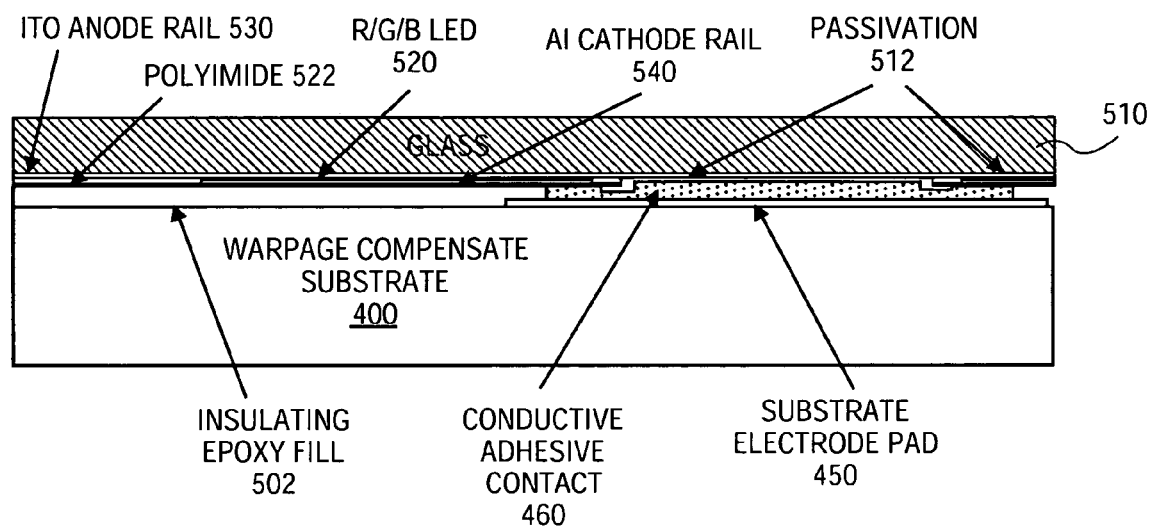
FIG. 6 depicts a block diagram illustrating an OLED display panel module.

FIG. 6 depicts OLED display panel module 500 formed utilizing warpage compensated substrate 400, in accordance with a further embodiment. As illustrated, the OLED display panel module 500 includes warpage compensated substrate 400 having substrate electrode pads 450 and adhesive contact 460. The adhesive contact 460 enables electronic connection between the electrodes 450 and (red/blue/green (R/G/B)) LED 520. The OLED includes glass substrate 510, including an indium-tin oxide (ITO) anode rail 530, as well as aluminum (Al) cathode rail 540, as well as passivation layer 512. In one embodiment, the passivation overlies cathold rail 540 and protective layer 522 of, for example, silicon dioxide ($SiO_2$) polyamide disposed between a passivation layer 512 and warpage compensation substrate 400.

In addition, conductive adhesive contact 560 is utilized to provide an electronic connection between substrate electrode pad 450 and Al cathode rail 540 to provide a voltage potential to LED 520. As such, in accordance with one embodiment, an OLED display panel module assembly 500 is generated with red LED 520, green LED 520, as well as blue LED 520 to form an OLED display panel cell. As such, utilizing any combination of red, blue or green, a plurality of OLED display panel cells may be formed within a flat panel display device to generate a desired image.

Accordingly, utilizing embodiments described herein, an OLED display panel module assembly 500 may be formed utilizing conventional substrates, which have substandard warpage levels. Therefore, by compensating warpage levels of various substrates, an OLED display panel module assembly, as well as an OLED display panel cells are formed at a lower cost than conventional means. Consequently, flat panel display screen, may be manufactured at drastically lowered costs by utilizing OLED display panel module assemblies described according to embodiments of the present invention.

Operation

Figure 7:
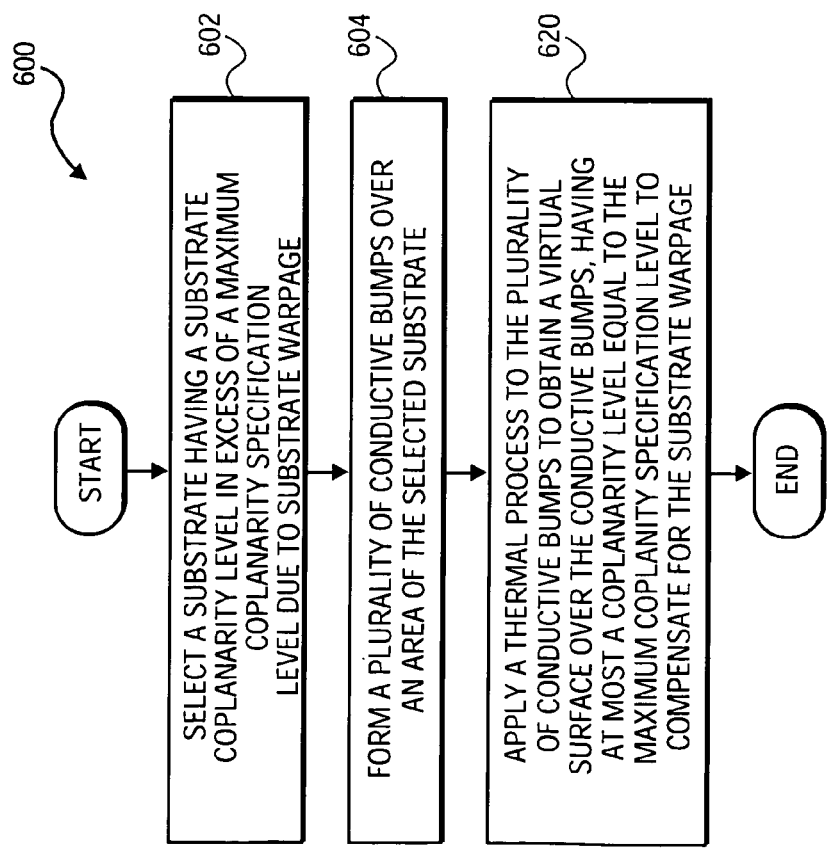
FIG. 7 depicts a flowchart illustrating a method for performing warpage compensation of a selected substrate to enable usage of the substrate within an OLED display panel module assembly.

FIG. 7 depicts a flowchart illustrating method 600 for warpage compensation of substrate in order to enable usage of a substrate within an OLED display panel module assembly in accordance with one embodiment. Accordingly, at process block 602, a substrate is selected having a coplanarity level in excess of a maximum coplanarity specification level due to warpage of the substrate. As indicated above, substrates traditionally used within the semiconductor industry, such as alumina ceramic, low temperature co-fired ceramic and other various ceramics, as well as printed circuit boards utilizing organic/(plastic) substrate materials. These substrates generally exhibit significant warpage levels, which may be in the range of 60 micrometers per inch through 700 micrometers per inch.

Once the substrate is selected, a plurality of conductive bumps are formed over an area of the substrate, at process block 604. In one embodiment, the conductive bumps are comprised of a material, which includes electric conductivity as well as deformation characteristics at certain temperatures. In one embodiment, solder bumps (e.g., lead-tin solder bumps) may be utilized; however, the conductive bumps include, but are not limited to, conductive, plastic-elastic materials, such as synthetic polymers (plastics) including rubber, or the like. Finally, at process block 620, a thermal process is applied to the plurality of conductive bumps to obtain a virtual surface over the conductive bumps, having at most a coplanarity level equal to the maximum coplanarity specification level to thereby compensate for warpage of the selected substrate.

Figure 8:
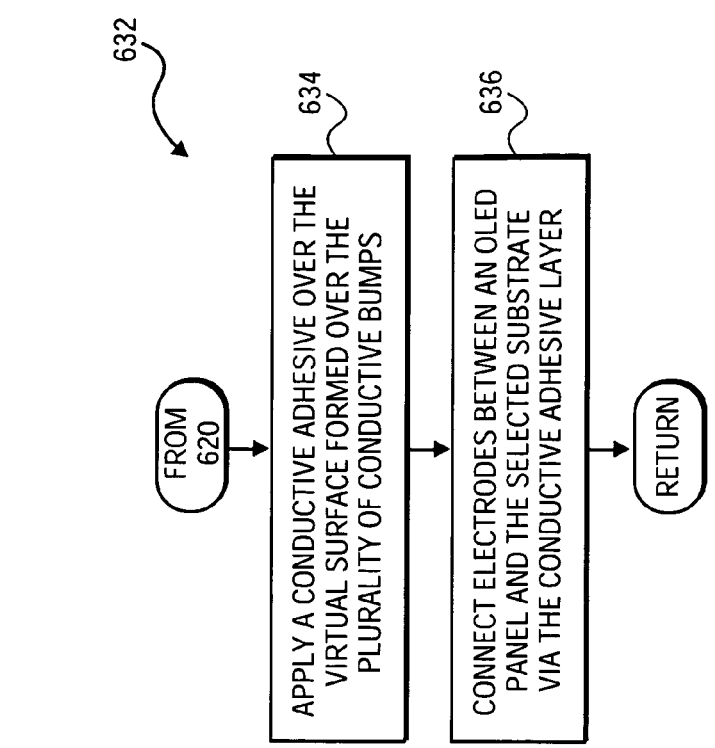
FIG. 8 depicts a block diagram illustrating a method for coupling an OLED panel to a warpage compensated substrate.

FIG. 8 depicts a flowchart illustrating an additional method 632 for forming of an OLED display panel module assembly utilizing the warpage compensated substrate, formed in accordance with method 600, as depicted in FIG. 7. At process block 634, a conductive adhesive is applied as a planar layer over the virtual surface of the plurality of conductive bumps. Once applied, electrodes between an OLED panel and the selected substrate are connected via the conductive adhesive material, using, for example, screen printing onto glass substrate 510 to provide the connection. For example, as depicted with reference to FIG. 5, OLED electrode 240 is connected with electrode pad 450 via conductive adhesive layer 460. Once such connection is formed, the substrate may apply a voltage potential via electrode pad 450 to electrode 240 in order to generate light output 470 via OLED structure 200.

Figure 9:
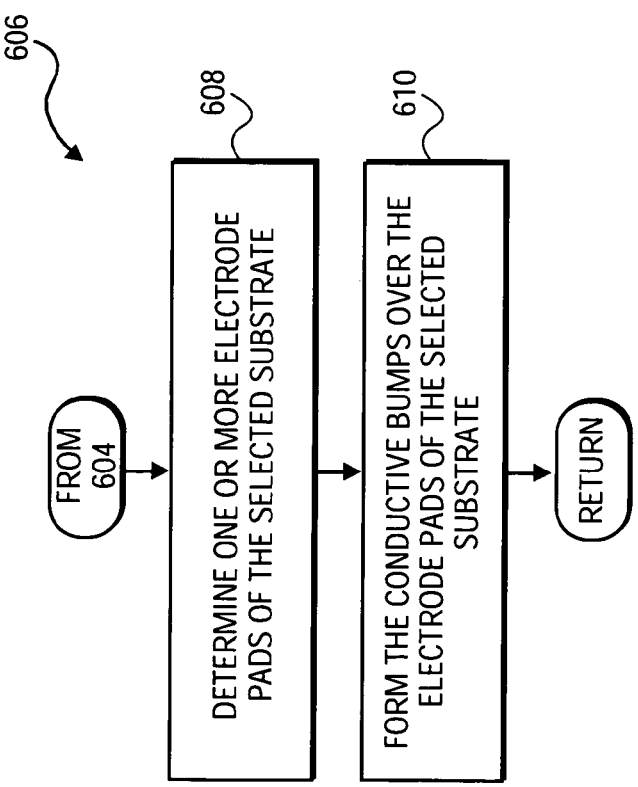
FIG. 9 depicts a flowchart illustrating a method for forming a plurality of conductive bumps over an area of a selected substrate.

FIG. 9 depicts a flowchart illustrating an additional method 606 for forming the conductive bumps of process block 604, as depicted in FIG. 7. At process block 608, one or more electrode pads of the selected substrate are determined. Once determined, at process block 610, the conductive bumps are formed over the electrode pads of the selected substrate. In one embodiment, the conductive bumps may be comprised of any material which provides electrical conductivity, as well as containing a deformation characteristic at a certain temperature. Accordingly, the soft bumps may be made of any metal, such as for example, solder, as well as conductive plastic-elastic materials, such as synthetic polymers (plastics), including, but not limited to, rubber. In one embodiment, when the conductive bumps are comprised of solder, the connection between the OLED electrode and the substrate electrode pads may be performed via solder joint interconnection.

Figure 10:
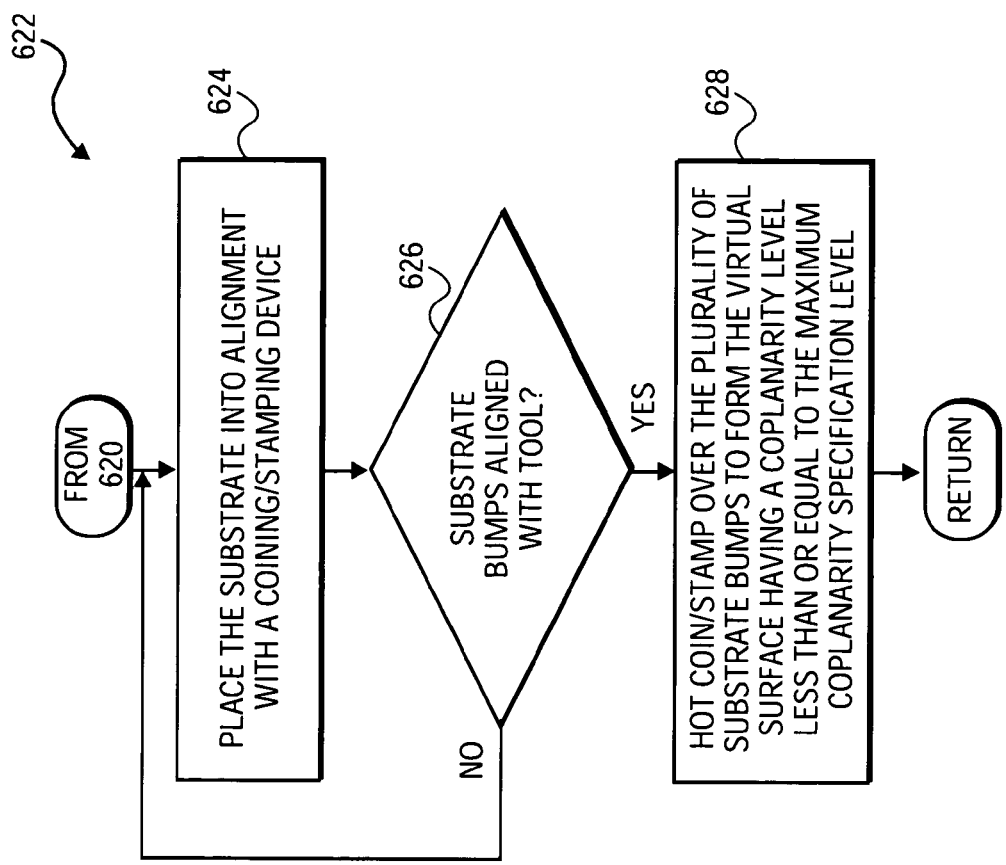
FIG. 10 depicts a flowchart illustrating an additional method for applying a thermal process to the plurality of conductive bumps to obtain a virtual surface.

FIG. 10 depicts a flowchart illustrating an additional method 622 for applying the thermal process of process block 620, as depicted in FIG. 7 and in accordance with the further embodiment of the present invention. As such, at process block 624, the substrate is placed into alignment within a coining/stamping device. Next, at process block 626, it is determined whether the substrate bumps are aligned with the tool. Once aligned, at process block 628, hot coining/stamping is performed over the plurality of conductive bumps to form the virtual surface, for example, as depicted in FIGS. 4B and 4C.

Accordingly, the virtual surface will have a nearly perfect coplanarity level and certainly a coplanarity level, which is at most, equal to the maximum coplanarity specification level. As such, by using hot coining or stamping over the conductive bumps, the coplanarity of the formed virtual surface compensates for the warpage of the selected substrate. Accordingly, utilizing embodiments of the present invention, conventional substrate materials may be utilized within OLED display panel modules without having to undergo special treatments to the selected substrate to compensate for the warpage or spending significant capital for ceramics which comply with coplanarity specification value requirements.

Consequently, utilizing embodiments of the present invention, OLED display panel modules assembly may be formed at drastically lower costs. As such, OLED display panel cells of R/G/B LEDs display panel modules assemblies may be utilized to form flat panel displays with full color and full motion, including a level of brightness and sharpness not possible with traditional devices. Likewise, interconnection systems for OLED display devices may select from a vast variety of substrate materials, including for example, thin film substrates to utilize within the OLED display panel module assembly process.

Alternate Embodiments

Several aspects of one implementation of the OLED display panel module assembly utilizing a warpage compensated substrate have been described. However, various implementations of the warpage compensation provide numerous features including, complementing, supplementing, and/or replacing the features described above. Features can be implemented as part of any assembly having strict coplanarity requirements in different embodiment implementations. In addition, the foregoing description, for purposes of explanation, used specific nomenclature to provide a thorough understanding of the embodiments presented. However, it will be apparent to one skilled in the art that the specific details are not required in order to practice the embodiments.

In addition, although an embodiment described herein is directed to a OLED display panel module assembly, it will be appreciated by those skilled in the art that the embodiments can be applied to other systems. In fact, systems for warpage compensation fall within the embodiments, as defined by the appended claims. The embodiments described above were chosen and described in order to best explain the principles of the embodiments and its practical applications. These embodiments were chosen to thereby enable others skilled in the art to best utilize the various embodiments with various modifications as are suited to the particular use contemplated.

It is to be understood that even though numerous characteristics and advantages of various embodiments have been set forth in the foregoing description, together with details of the structure and function of various embodiments, this disclosure is illustrative only. In some cases, certain subassemblies are only described in detail with one such embodiment. Nevertheless, it is recognized and intended that such subassemblies may be used in other embodiments. Changes may be made in detail, especially matters of structure and management of parts within the principles of the embodiments to the full extent indicated by the broad general meaning of the terms in which the appended claims are expressed.

Having disclosed exemplary embodiments and the best mode, modifications and variations may be made to the disclosed embodiments while remaining within the scope of the embodiments as defined by the following claims.

What is claimed is:

1. A method comprising:
   selecting a substrate wherein a coplanarity level of a surface of the substrate exceeds a maximum coplanarity specification value;
   forming a plurality of conductive bumps over an area of the selected substrate surface; and
   reforming the conductive bumps, to provide a virtual surface over the conductive bumps, the virtual surface having at most a coplanarity level equal to the maximum coplanarity specification value to compensate for substrate warpage.

2. The method of claim 1, further comprising:
   applying a conductive adhesive over the virtual surface formed over the plurality of conductive bumps; and
   connecting electrodes between an OLED panel and the selected substrate via the conductive adhesive layer.

3. The method of claim 1, wherein the maximum coplanarity specification value equals 30 micrometers per inch and a substrate warpage level of the selected substrate is within the range of 60 micrometers per inch through 700 micrometers per inch.

4. The method of claim 1, wherein the selected substrate is comprised of a material selected from one of alumina ceramic, low-temperature co-fired ceramic, organic material and plastic material.

5. The method of claim 1, wherein forming the conductive bumps further comprises:
   determining one or more electrode pads of the selected substrate; and
   forming the conductive bumps over the determined electrode pads of the selected substrate.

6. The method of claim 1, wherein reforming the conductive bumps further comprises:
   placing the substrate into alignment with a coining/stamping device;
   hot coining/stamping over the plurality of substrate bumps to form the virtual surface having the coplanarity value at most equal to the maximum coplanarity specification value, such that the coplanarity of the virtual surface compensates for the warpage of the selected substrate.

7. The method of claim 1, wherein the conductive bumps are comprised of one of a conductive metal and a conductive, plastic elastic material.

8. The method of claim 1, wherein the conductive bumps are comprised of rubber.

9. The method of claim 2, wherein connecting further comprises:
   connecting an OLED panel electrode to substrate electrode pads of the selected substrate via the conductive adhesive layer formed over the virtual surface of the plurality of conductive bumps.

10. The method of claim 9, wherein the OLED electrode is connected to substrate electrode pads via solder joint interconnection.

* * * * *

UNITED STATES PATENT AND TRADEMARK OFFICE
CERTIFICATE OF CORRECTION

PATENT NO. : 7,171,743 B2  
APPLICATION NO. : 10/841350  
DATED : February 6, 2007  
INVENTOR(S) : Ishida Page 1 of 1

It is certified that error appears in the above-identified patent and that said Letters Patent is hereby corrected as shown below:

In column 3, at line 63, delete "rumination" and insert --lumination--.
In column 4, at line 18, delete "rumination" and insert --lumination--.

Signed and Sealed this

Fifteenth Day of April, 2008

JON W. DUDAS
*Director of the United States Patent and Trademark Office*